US012448681B2

(12) United States Patent
Liu et al.

(10) Patent No.: US 12,448,681 B2
(45) Date of Patent: Oct. 21, 2025

(54) METHODS OF FORMING MOLYBDENUM-CONTAINING FILMS DEPOSITED ON ELEMENTAL METAL FILMS

(71) Applicant: MERCK PATENT GMBH, Darmstadt (DE)

(72) Inventors: Guo Liu, Haverhill, MA (US); Jacob Woodruff, Lexington, MA (US); Jean-Sébastien Lehn, Somerville, NJ (US)

(73) Assignee: MERCK PATENT GMBH, Darmstadt (DE)

( * ) Notice: Subject to any disclaimer, the term of this patent is extended or adjusted under 35 U.S.C. 154(b) by 76 days.

(21) Appl. No.: 17/926,818

(22) PCT Filed: May 21, 2021

(86) PCT No.: PCT/EP2021/063590

§ 371 (c)(1),
(2) Date: Nov. 21, 2022

(87) PCT Pub. No.: WO2021/239596

PCT Pub. Date: Dec. 2, 2021

(65) Prior Publication Data

US 2023/0203645 A1 Jun. 29, 2023

Related U.S. Application Data

(60) Provisional application No. 63/030,077, filed on May 26, 2020.

(51) Int. Cl.

| | |
|---|---|
| ***C23C 16/08*** | (2006.01) |
| ***C23C 16/455*** | (2006.01) |
| ***C23C 16/52*** | (2006.01) |

(52) U.S. Cl.
CPC ........ *C23C 16/08* (2013.01); *C23C 16/45534* (2013.01); *C23C 16/45553* (2013.01); *C23C 16/52* (2013.01)

(58) Field of Classification Search
CPC .............. C23C 16/08; C23C 16/45534; C23C 16/45553; C23C 16/52; C23C 16/14; C23C 16/16; C23C 16/45525; C23C 16/45536
See application file for complete search history.

(56) References Cited

U.S. PATENT DOCUMENTS 6,081,016 A * 6/2000 Tanaka .............. H01L 21/76895 257/E21.59
6,635,965 B1 10/2003 Lee et al.
(Continued)

FOREIGN PATENT DOCUMENTS

CN 110731003 A 1/2020
KR 20110014191 A 2/2011
(Continued)

OTHER PUBLICATIONS

International Search Report from corresponding PCT Application No. PCT/EP2021/063590 dated Sep. 9, 2021.
(Continued)

*Primary Examiner* — Hai Y Zhang
(74) *Attorney, Agent, or Firm* — Harness Dickey & Pierce P.L.C.

(57) ABSTRACT

Methods of forming molybdenum-containing films are provided. The methods include thermally depositing a first film on a surface of a substrate, for example, at a first temperature less than or equal to about 400° C., and thermally depositing the molybdenum-containing film (second film) on at least a portion of the first film, for example, at a second temperature of greater than about 400° C. The first film can include an elemental metal, for example, tungsten, molybdenum, ruthe-
(Continued)

nium, or cobalt. The second film includes a reaction product of a molybdenum-containing precursor and a reducing agent.

9 Claims, 7 Drawing Sheets

(56) References Cited

U.S. PATENT DOCUMENTS

| | | | |
|---|---|---|---|
| 11,230,764 B2 | 1/2022 | Lehn et al. | |
| 2011/0180796 A1 | 7/2011 | Yamazaki et al. | |
| 2017/0037513 A1 | 2/2017 | Haukka et al. | |
| 2017/0350013 A1 | 12/2017 | Chan et al. | |
| 2018/0019165 A1 | 1/2018 | Baum et al. | |
| 2018/0294187 A1* | 10/2018 | Thombare | H01L 23/5226 |
| 2018/0347041 A1 | 12/2018 | Kim et al. | |
| 2019/0067094 A1 | 2/2019 | Zope et al. | |
| 2019/0067095 A1 | 2/2019 | Zhu et al. | |
| 2020/0075403 A1 | 3/2020 | Thombare et al. | |

FOREIGN PATENT DOCUMENTS

| | | | | |
|---|---|---|---|---|
| KR | 20160140458 A | 12/2016 | | |
| TW | 201907037 A | 2/2019 | | |
| TW | 201946284 A | 12/2019 | | |
| WO | WO-2009146423 A1 * | 12/2009 | | C23C 16/16 |
| WO | WO-2019143632 A1 | 7/2019 | | |
| WO | WO-2019209289 A1 | 10/2019 | | |

OTHER PUBLICATIONS

Written Opinion from corresponding PCT Application No. PCT/EP2021/063590 dated Sep. 9, 2021.

Search Report from Singapore Application No. 11202254283Q dated Aug. 7, 2024.

Written Opinion from Singapore Application No. 11202254283Q dated Aug. 7, 2024.

Office Action from Taiwan Application No. 110118395 dated Oct. 8, 2024.

Search Report from Taiwan Application No. 110118395 dated Oct. 8, 2024.

Office Action from Chinese Application No. 202180035956.3 dated Feb. 27, 2025.

Office Action from Japanese Application No. 2022-572667 dated Mar. 14, 2025.

Office Action from Korean Application No. 10-2022-7041695 dated Aug. 16, 2025.

* cited by examiner

METHODS OF FORMING MOLYBDENUM-CONTAINING FILMS DEPOSITED ON ELEMENTAL METAL FILMS

CROSS-REFERENCE TO RELATED APPLICATIONS

This patent application is a U.S. national stage application under 35 U.S.C. § 371 of International Patent Application No. PCT/EP2021/063590 filed on 21 May 2021, which claims priority to and the benefit of U.S. Provisional Patent Application No. 63/030,077 filed on 26 May 2020. The entire disclosures of each of the above recited applications are incorporated herein by reference.

FIELD

The present invention relates to methods for forming molybdenum-containing films deposited on elemental metal films.

BACKGROUND

Various precursors are used to form thin films and a variety of deposition techniques have been employed. Such techniques include reactive sputtering, ion-assisted deposition, chemical vapor deposition (CVD) (also known as metalorganic CVD or MOCVD), and atomic layer deposition (also known as atomic layer epitaxy). CVD and ALD processes are increasingly used as they have the advantages of enhanced compositional control, high film uniformity, and effective control of doping. Moreover, CVD and ALD processes provide excellent conformal step coverage on highly non-planar geometries associated with modern microelectronic devices.

CVD is a chemical process whereby precursors are used to form a thin film on a substrate surface. In a typical CVD process, the precursors are passed over the surface of a substrate (e.g., a wafer) in a low pressure or ambient pressure reaction chamber. The precursors react and/or decompose on the substrate surface creating a thin film of deposited material. Plasma can be used to assist in reaction of a precursor or for improvement of material properties. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is a chemical method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction chamber. A second precursor or co-reactant is then passed over the substrate surface and reacts with the first precursor, forming a second monolayer of film over the first-formed monolayer of film on the substrate surface. Plasma may be used to assist with reaction of a precursor or co-reactant or for improvement in materials quality. This cycle is repeated to create a film of desired thickness.

Thin films, and in particular thin metal-containing films, have a variety of important applications, such as in nanotechnology and the fabrication of semiconductor devices. Examples of such applications include capacitor electrodes, gate electrodes, adhesive diffusion barriers, and integrated circuits.

The continual decrease in the size of microelectronic components has increased the need for improved thin film technologies. Further, there is a need for deposition of molybdenum as next generation metal electrodes and caps or liners in logic and memory semiconductor manufacturing. While low-resistivity molybdenum films can be deposited by ALD or CVD using $H_2$ reduction of a molybdenum halide, such as $MoCl_5$, or an oxyhalide, such as $MoO_2Cl_2$, at higher temperatures (e.g., greater than 400° C.) such molybdenum films can suffer from little to no growth or scattered island growth on oxide and nitride surfaces due to long nucleation delays. Diborane can be used to deposit boron as a nucleation layer, but use of diborane can result in boron contamination as well nonuniform deposition. Therefore, processes for forming molybdenum-containing films on metal-containing liners are needed, which can achieve lower resistivity films with improved molybdenum nucleation.

SUMMARY OF THE INVENTION

Thus, provided herein are methods of forming a molybdenum-containing film on a substrate. The method includes thermally depositing a first film including an elemental metal on a surface of a substrate at a first temperature less than or equal to about 400° C. The elemental metal can be tungsten, molybdenum, or a combination thereof. The method further includes thermally depositing a second film on at least a portion of the first film at a second temperature of greater than about 400° C. The second film includes a reaction product of a molybdenum-containing precursor with a reducing agent.

In other embodiments, another method of forming a molybdenum-containing film on a substrate is provided herein. The method includes thermally depositing a first film including an elemental metal on a surface of a substrate at a first temperature less than or equal to about 400° C. The elemental metal can be selected from the group consisting of ruthenium, cobalt, and a combination thereof. The method further includes thermally depositing a second film on at least a portion of the first film at a second temperature of greater than about 400° C. The second film includes a reaction product of a molybdenum-containing precursor with a reducing agent.

Other embodiments, including particular aspects of the embodiments summarized above, will be evident from the detailed description that follows.

DETAILED DESCRIPTION

Figure 1:
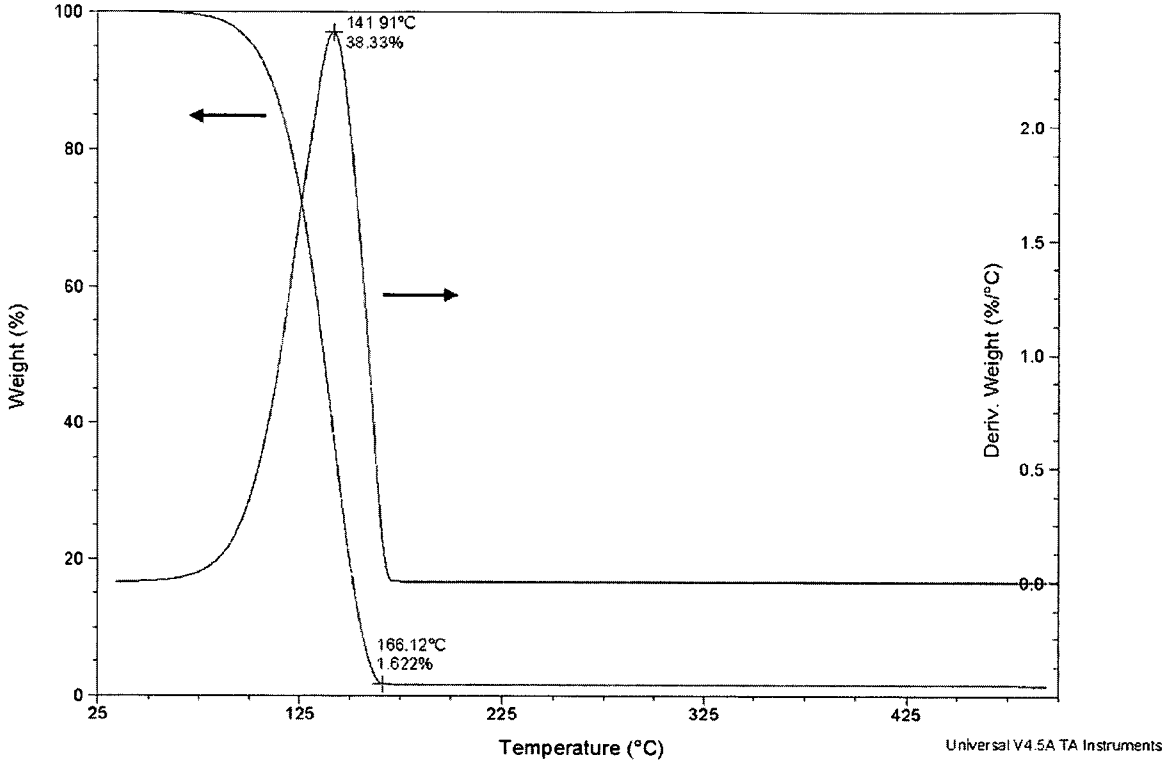
FIG. 1 is a graphical representation of thermal gravimetric analysis (TGA) data demonstrating weight (%) vs. temperature of $MoO_2Cl_2$.

Before describing several exemplary embodiments of the present technology, it is to be understood that the technology is not limited to the details of construction or process steps set forth in the following description. The present technology is capable of other embodiments and of being practiced or being carried out in various ways.

The inventors have discovered processes including two steps to improve molybdenum deposition and films formed therefrom. The processes may include a first step including depositing a first film or a liner, such as an elemental molybdenum-containing film or an elemental ruthenium-containing film, on a substrate using a first metal-containing precursor and a co-reactant. A second film (i.e., a molybdenum-containing film) can be formed on the first film by delivering a molybdenum-containing precursor and a reducing agent in a second step. Advantageously, the processes described herein can be performed at lower temperatures, for example, the first step can be performed at a temperature of less than or equal to 400° C. Additionally, a conformal molybdenum-containing second film with low resistivity can be achieved.

Definitions

For purposes of this invention and the claims hereto, the numbering scheme for the Periodic Table Groups is according to the IUPAC Periodic Table of Elements.

The term "and/or" as used in a phrase such as "A and/or B" herein is intended to include "A and B", "A or B", "A", and "B".

The terms "substituent", "radical", "group", and "moiety" may be used interchangeably.

As used herein, the terms "metal-containing complex" (or more simply, "complex") and "precursor" are used interchangeably and refer to a metal-containing molecule or compound which can be used to prepare a metal-containing film by a deposition process such as, for example, ALD or CVD. The metal-containing complex may be deposited on, adsorbed to, decomposed on, delivered to, and/or passed over a substrate or surface thereof, as to form a metal-containing film.

As used herein, the term "metal-containing film" includes not only an elemental metal film as more fully defined below, but also a film which includes a metal along with one or more elements, for example a metal nitride film, metal silicide film, a metal carbide film and the like.

As used herein, the terms "elemental metal," "elemental metal film" and "pure metal film" are used interchangeably and refer to a film which consists of, or consists essentially of, pure metal. For example, an elemental metal film may include 100% pure metal or the elemental metal film may include at least about 70%, at least about 80%, at least about 90%, at least about 95%, at least about 96%, at least about 97%, at least about 98%, at least about 99%, at least about 99.9%, or at least about 99.99% pure metal along with one or more impurities. However, a film comprising an elemental metal is distinguished from binary films including a metal and a non-metal (e.g., C, N) and ternary films including a metal and two non-metals (e.g., C, N), though, a film comprising elemental metal may include some amount of impurities. Unless context dictates otherwise, the term "metal film" shall be interpreted to mean an elemental metal film.

As used herein, the terms "deposition process" and "thermally depositing" are used to refer to any type of deposition technique, including but not limited to, CVD and ALD. In various embodiments, CVD may take the form of conventional (i.e., continuous flow) CVD, liquid injection CVD, plasma-enhanced CVD, or photo-assisted CVD. CVD may also take the form of a pulsed technique, i.e., pulsed CVD. ALD is used to form a metal-containing film by vaporizing and/or passing at least one metal complex disclosed herein over a substrate surface. For conventional ALD processes see, for example, George S. M., et al. *J. Phys. Chem.,* 1996, 100, 13121-13131. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

Methods of Forming Molybdenum-Containing Films

As stated above, methods of forming molybdenum-containing (Mo-containing) films are provided herein. The method may comprise a first step and a second step. In any embodiment, the first step can include forming a first film (or a liner) on a surface of a substrate. The first film may comprise an elemental metal. For example, the elemental metal may be selected from the group consisting of tungsten (W), molybdenum (Mo), ruthenium (Ru), cobalt (Co), and combinations thereof. In any embodiment, the elemental metal may be tungsten (W), molybdenum (Mo), or a combination thereof. In another embodiment, the elemental metal may be selected from the group consisting of ruthenium (Ru), cobalt (Co), and combinations thereof.

The first film comprising an elemental metal (e.g., Mo, Ru) may have a thickness, measured by X-ray Fluorescence (XRF), of greater than or equal to about 1 nm, greater than or equal to about 2 nm, greater than or equal to about 4 nm, greater than or equal to about 6 nm, greater than or equal to about 8 nm, greater than or equal to about 10 nm, greater than or equal to about 12 nm, or about 15 nm; or from about 1 nm to about 15 nm, about 2 nm to about 12 nm, about 2 nm to about 10 nm, or about 6 nm to about 12 nm.

Additionally or alternatively, the first film comprising an elemental metal (e.g., Mo, Ru) may have a conductivity of less than or equal to about 300 μΩ·cm, less than or equal to about 250 μΩ·cm, less than or equal to about 200 μΩ·cm, less than or equal to about 175 μΩ·cm, less than or equal to about 150 μΩ·cm, less than or equal to about 125 μΩ·cm, or 100 μΩ·cm; or from about 100 μΩ·cm to about 300 μΩ·cm, about 100 μΩ·cm to about 250 μΩ·cm, about 100 μΩ·cm to about 200 μΩ·cm, or about 100 μΩ·cm to about 150 μΩ·cm.

In any embodiment, thermally depositing the first film comprises delivering a first metal-containing precursor and a co-reactant to the substrate. The first metal-containing precursor may be any suitable tungsten-containing precursor, molybdenum-containing precursor, ruthenium-containing precursor, cobalt-containing precursor, or combination thereof. Examples of molybdenum-containing precursors include, but are not limited to a molybdenum halide, a molybdenum oxyhalide, a molybdenum hexacarbonyl, or a combination thereof. A suitable molybdenum halide includes but is not limited to $MoCl_5$ or $MoF_6$. A suitable molybdenum oxyhalide includes, but is not limited to $MoOCl_4$ or $MoO_2Cl_2$. Examples of tungsten precursors include, but are not limited to $WCl_5$, $WF_6$, and $W(CO)_6$. Examples of ruthenium-containing precursors include, but are not limited to a zerovalent ruthenium (Ru(0)) precursor, such as, but not limited to η4-2,3-dimethylbutadiene ruthenium tricarbonyl ($(DMBD)Ru(CO)_3$) and (ethylbenzyl)(1-ethyl-1,4-cyclohexadienyl) (EtBz)Ru(EtCHD). In some embodiments, the first film is formed by delivering a first metal-containing precursor comprising a molybdenum halide as described herein and a co-reactant as further described below to a substrate. In other embodiments, the first film is formed by delivering a first metal-containing precursor comprising a zerovalent ruthenium precursor as described herein and a co-reactant as further described below to a substrate.

In various aspects, the co-reactant can be selected from the group consisting of nitrogen plasma, ammonia plasma, oxygen, air, water, $H_2O_2$, ozone, $NH_3$, $H_2$, i-PrOH, t-BuOH, $N_2O$, ammonia, an alkylhydrazine, a hydrazine, ozone, 1,4-di-trimethylsilyl-2-methyl-cyclohexa-2,5-diene (CHD), 1-trimethylsilylcyclohexa-2,5-diene, 1,4-bis-trimethylsilyl-1,4-dihydropyrazine (DHP), and a combination of any two or more thereof. In various aspects, the alkylhydrazine may be a $C_1$-$C_8$-alkylhydrazine, a $C_1$-$C_4$-alkylhydrazine, or a $C_1$-$C_2$-alkylhydrazine. For example, the alkyl hydrazine may be methylhydrazine, ethylhydrazine, propylhydrazine, or butylhydrazine (including tertiary-butylhydrazine).

In any embodiment, the second step of the method may include thermally depositing a second film (also referred to as "a molybdenum-containing film") on at least a portion of the first film. Thermally depositing the second film comprises delivering a molybdenum-containing precursor and a reducing agent to the substrate. The second film can comprise a reaction product of a molybdenum-containing precursor with a reducing agent. The second film may also optionally include dissociated moieties of the molybdenum-containing precursor, dissociated moieties of the reducing agent, or a combination thereof. The molybdenum-containing precursor may be, for example, a molybdenum halide, a molybdenum oxyhalide, or a combination thereof. The molybdenum halide may be $MoCl_5$ or $MoF_6$, and the molybdenum oxyhalide may be $MoOCl_4$ or $MoO_2Cl_2$. The reducing agent may be any suitable reducing agent including, but not limited to hydrogen, hydrogen plasma, or a combination thereof. It is contemplated herein, that the first film and the second film can each be continuous or discontinuous layers.

Advantageously, the methods described herein can result in a second film with a lower resistivity. For example, the second film may have a resistivity of less than or equal to about 300 μΩ-cm, less than or equal to about 250 μΩ-cm, less than or equal to about 200 μΩ-cm, less than or equal to about 175 μΩ-cm, less than or equal to about 150 μΩ-cm, less than or equal to about 125 μΩ-cm, less than or equal to about 100 μΩ-cm, less than or equal to about 75 μΩ-cm, less than or equal to about 50 μΩ-cm; or about 30 μΩ-cm; or from about 30 μΩ-cm to about 300 μΩ-cm, about 30 μΩ-cm to about 200 μΩ-cm, about 30 μΩ-cm to about 175 μΩ-cm, about 30 μΩ-cm to about 150 μΩ-cm, about 30 μΩ-cm to about 100 μΩ-cm, or about 30 μΩ-cm to about 50 μΩ-cm.

In any embodiment, the first step, the second step, or a combination thereof can include use of plasma. Use of plasma can, for example, enhance reaction of one or more of a first metal-containing precursor, a molybdenum-containing precursor, a co-reactant, and a reducing agent. Additionally or alternatively, use of plasma can improve film quality.

In some embodiments, the first metal-containing precursor, the molybdenum-containing precursor, or a combination thereof may be dissolved in a suitable solvent such as a hydrocarbon or an amine solvent to facilitate a vapor deposition process. Appropriate hydrocarbon solvents include, but are not limited to, aliphatic hydrocarbons, such as hexane, heptane and nonane; aromatic hydrocarbons, such as toluene and xylene; and aliphatic and cyclic ethers, such as diglyme, triglyme, and tetraglyme. Examples of appropriate amine solvents include, without limitation, octylamine and N,N-dimethyldodecylamine. For example, the first metal-containing precursor, the molybdenum-containing precursor, or a combination thereof may be dissolved in toluene to yield a solution with a concentration from about 0.05 M to about 1 M.

In alternative embodiments, the first metal-containing precursor, the molybdenum-containing precursor, or a combination thereof may be delivered "neat" (undiluted by a carrier gas) to a substrate surface. Thus, the precursors disclosed herein and utilized in these methods may be liquid, solid, or gaseous. Typically, the ruthenium precursors and molybdenum precursors are liquids or solids at ambient temperatures with a vapor pressure sufficient to allow for consistent transport of the vapor to the process chamber, for example, at higher temperatures.

In various aspects, the substrate surface can comprise a metal, a dielectric material, a metal oxide material, or a combination thereof. The dielectric material can be a low-κ dielectric or a high-κ dielectric. Examples of suitable dielectric materials include, but are not limited to $SiO_2$, SiON, $Si_3N_4$, and a combination thereof. Examples of suitable metal oxide materials include, but are not limited to $HfO_2$, $ZrO_2$, $SiO_2$, $Al_2O_3$, $TiO_2$, and combinations thereof. Other suitable substrate materials include, but are not limited to crystalline silicon, Si(100), Si(111), glass, strained silicon, silicon on insulator (SOI), doped silicon or silicon oxide(s)

(e.g., carbon doped silicon oxides), germanium, gallium arsenide, tantalum, tantalum nitride, aluminum, copper, ruthenium, titanium, titanium nitride, tungsten, tungsten nitride, tungsten carbonitride (WCN), and any number of other substrates commonly encountered in nanoscale device fabrication processes (e.g., semiconductor fabrication processes). In some embodiments, the substrate can comprise one or more of silicon oxide, aluminum oxide, titanium nitride, tungsten nitride, tungsten carbon nitride, and tantalum nitride. As will be appreciated by those of skill in the art, substrates may be exposed to a pretreatment process to polish, etch, reduce, oxidize, hydroxylate, anneal and/or bake the substrate surface. In one or more embodiments, the substrate surface contains a hydrogen-terminated surface.

The methods provided herein, particularly the thermal deposition of the first film and the second film, encompass various types of ALD and CVD processes such as, but not limited to, continuous or pulsed injection processes, liquid injection processes, photo-assisted processes, plasma-assisted, and plasma-enhanced processes. For purposes of clarity, the methods of the present technology specifically include direct liquid injection processes. For example, in direct liquid injection CVD ("DLI-CVD"), a solid or liquid metal complex may be dissolved in a suitable solvent and the solution formed therefrom injected into a vaporization chamber as a means to vaporize the metal complex. The vaporized metal complex is then transported/delivered to the substrate surface. In general, DLI-CVD may be particularly useful in those instances where a metal complex displays relatively low volatility or is otherwise difficult to vaporize. For example, the first step and the second step independently can be an ALD or a CVD process.

In some embodiments, conventional or pulsed CVD is used to form a first film as described herein and/or a second film as described herein by vaporizing and/or passing the first metal-containing precursor and/or the molybdenum-containing precursor, all disclosed herein, over a substrate surface. For conventional CVD processes see, for example Smith, Donald (1995). *Thin-Film Deposition: Principles and Practice*. McGraw-Hill.

In other embodiments, photo-assisted CVD is used to form a first film as described herein and/or a second film as described herein by vaporizing and/or passing the first metal-containing precursor and/or the molybdenum-containing precursor, all disclosed herein, over a substrate surface.

In one embodiment, CVD growth conditions for first metal-containing precursor and/or a molybdenum-containing precursor disclosed herein include, but are not limited to:

(1) Substrate temperature: 50-600° C.

(2) Evaporator temperature (metal precursor temperature): 0-120° C.

(3) Reactor pressure: 0-200 Torr (4) Argon or nitrogen carrier gas flow rate: 0-100 sccm (5) Oxygen flow rate: 0-100 sccm (6) Hydrogen flow rate: 0-50 sccm (7) Metal precursor pulse time: 0.01-5 sec (8) Purge gas pulse time: 1-30 sec (9) Run time: will vary according to desired film thickness In another embodiment, photo-assisted CVD is used to form a metal-containing film by vaporizing and/or passing the first metal-containing precursor and/or the molybdenum-containing precursor, all disclosed herein, over a substrate surface In some embodiments, conventional (i.e., pulsed injection) ALD is used to form a first film as described herein and/or a second film as described herein by vaporizing and/or passing the first metal-containing precursor and/or the molybdenum-containing precursor, all disclosed herein, over a substrate surface. For conventional ALD processes see, for example, George S. M., et al. *J. Phys. Chem.,* 1996, 100, 13121-13131.

In other embodiments, liquid injection ALD is used to form a first film as described herein and/or a second film as described herein by vaporizing and/or passing the first metal-containing precursor and/or the molybdenum-containing precursor, all disclosed herein, over a substrate surface, wherein the aforementioned precursor is delivered to the reaction chamber by direct liquid injection as opposed to vapor draw by a bubbler. For liquid injection ALD processes see, for example, Potter R. J., et al., *Chem. Vap. Deposition,* 2005, 11(3), 159-169.

In other embodiments, photo-assisted ALD is used to form a first film as described herein and/or second film as described herein by vaporizing and/or passing the first metal-containing precursor and/or the molybdenum-containing precursor, all disclosed herein, over a substrate surface. For photo-assisted ALD processes see, for example, U.S. Pat. No. 4,581,249.

In other embodiments, plasma-assisted or plasma-enhanced ALD is used to form a first film as described herein and/or a second film as described herein by vaporizing and/or passing the first metal-containing precursor and/or the molybdenum-containing precursor, all disclosed herein, over a substrate surface.

Examples of ALD growth conditions for the first metal-containing precursor and/or a molybdenum-containing precursor disclosed herein include, but are not limited to:

(1) Substrate temperature: 200-700° C.

(2) Evaporator temperature (metal precursor temperature): 20-150° C.

(3) Reactor pressure: 0.01-200 Torr (4) Argon or nitrogen carrier gas flow rate: 0-100 sccm (5) Reactive gas (co-reactant or reducing agent) pulse time: 0.01-30 sec (6) Metal precursor pulse time: 0.01-10 sec (7) Purge gas pulse time: 1-10 sec (8) Pulse sequence (metal complex/purge/reactive gas/purge): will vary according to chamber size.

(9) Number of cycles: will vary according to desired film thickness, e.g., 1-100 cycles.

The reaction time, temperature and pressure for the methods described herein are selected to create the first film and the second film on the surface of the substrate. The reaction conditions will be selected based on the properties of the first metal-containing precursor and the molybdenum-containing precursor. The first and second steps can be carried out at atmospheric pressure but are more commonly carried out at a reduced pressure. For example, during the first step, thermally depositing the first film can be performed at pressure of greater than or equal to about 0.01 Torr, greater than or equal to about 0.1 Torr, greater than or equal to about 0.5 Torr, greater than or equal to about 1 Torr, greater than or equal to about 2 Torr, greater than or equal to about 4 Torr, greater than or equal to about 6 Torr, greater than or equal to about 8 Torr, or about 10 Torr; or from about 0.01 Torr to about 10 Torr, about 0.1 Torr to about 8 Torr, about 0.1 Torr to about 6 Torr, or about 2 Torr to about 6 Torr. Additionally or alternatively, during the second step, thermally depositing the second film can be performed at pressure of greater than or equal to about 1 Torr, greater than or equal to about 5 Torr, greater than or equal to about 10 Torr, greater than or equal to about 25 Torr, greater than or equal to about 50 Torr, greater than or equal to about 75 Torr, greater than or equal to about 100 Torr, greater than or equal to about 150 Torr, or about 200 Torr; or from about 1 Torr to about 200 Torr, about 1 Torr to about 100 Torr, about 1 Torr to about 50 Torr, or about 5 Torr to about 10 Torr.

The vapor pressure of the first metal-containing precursor and the molybdenum-containing precursor should be high enough to be practical in such applications. The substrate temperature should be low enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on various parameters, including the particular first metal-containing precursor and the molybdenum-containing precursor used as well as the pressure. In some embodiments, during the first step, thermally depositing the first film can be performed at a lower temperature, for example, a first temperature of less than or equal to about 500° C., less than or equal to about 450° C., less than or equal to about 400° C., less than or equal to about 350° C., less than or equal to about 300° C., less than or equal to about 290° C., less than or equal to about 275° C., less than or equal to about 250° C., less than or equal to about 225° C., or about 200° C.; or from about 200° C. to about 500° C., about 200° C. to about 400° C., about 200° C. to about 300° C., or about 225° C. to about 290° C. Additionally or alternatively, during the second step, thermally depositing the second film can be performed at a higher temperature, for example, a second temperature of greater than or equal to about 300° C., greater than or equal to about 350° C., greater than or equal to about 400° C., greater than or equal to about 450° C., greater than or equal to about 500° C., greater than or equal to about 550° C., greater than or equal to about 600° C., greater than or equal to about 650° C., or about 700° C.; or from about 300° C. to about 700° C., about 400° C. to about 600° C., about 400° C. to about 500° C., or about 400° C. to about 450° C. The aforementioned temperatures are understood to represent substrate temperature. In any embodiment, the first step, the second step, or both may be performed in inert atmospheres, for example, in argon atmospheres.

The properties of a specific first metal-containing precursor and a molybdenum-containing precursor for use in the deposition methods disclosed herein can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

A first metal-containing precursor and a molybdenum-containing precursor for use in the deposition methods will have all of the requirements for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

In further embodiments, the first step, for example during an ALD process, can include a first step cycle including delivering the first-metal containing precursor, the co-reactant, and a purge gas to the substrate. For example, the first-metal containing precursor can be pulsed for 0.01-1 seconds, followed by delivery of a purge gas for 2-15 seconds, followed by pulsing the co-reactant for 0.001-3 seconds, and followed by delivery of a purge gas for 2-15 seconds. The number of first step cycles can range from 1 to 100 cycles, 1 to 75 cycles, 1 to 50 cycles, 1 to 25 cycles, 1 to 10 cycles, or 1 to 5 cycles.

In various aspects, the second step, for example during a pulsed CVD process, can include a second step cycle including delivering the molybdenum-containing precursor, for example, pulsing the molybdenum-containing precursor in a flow of the reducing agent and the purge gas to the substrate. For example, the molybdenum-containing precursor can be pulsed for about 0.01-2 seconds in a flow of a reducing agent and a purge gas, wherein the reducing agent and purge gas are flowed for about 5-30 seconds. In some embodiments, the reducing agent may be flowed for shorter period of time than the purge gas. Alternatively, a reducing agent, a purge gas or both may be delivered to the substrate, for example, for about 5-30 seconds, after the molybdenum-containing precursor is pulsed. The number of pulses of molybdenum-containing precursors is determined by a desired thickness of the molybdenum-containing film, for example, the pulses can range from 1 to 500 pulses, 1 to 300 pulses, 1 to 200 pulses, 1 to 100 pulses, 1 to 50 pulses, or 1 to 25 pulses.

In alternative embodiments, the second step, for example during an ALD process, can include a second step cycle including delivering a molybdenum-containing precursor, a reducing agent, and a purge gas to the substrate. For example, a molybdenum-containing precursor can be pulsed for 0.01-2 seconds, followed by delivery of a purge gas for 2-10 seconds, followed by pulsing the reducing agent for 2-15 seconds, and followed by delivery of a purge gas for 2-10 seconds. The number of second step cycles can range from 1 to 1000 cycles, 1 to 750 cycles, 1 to 500 cycles, 1 to 250 cycles, 1 to 100 cycles, 1 to 75 cycles, 1 to 50 cycles, 1 to 25 cycles, 1 to 10 cycles, or 1 to 5 cycles.

Any suitable purge gas can be used in the first and second steps, for example, nitrogen, hydrogen and a noble gas, e.g., helium, neon, argon, krypton, xenon, etc.

In further embodiments, the methods described herein may be performed under conditions to provide conformal growth, for example, for a first film, a second film, or combination thereof. As used herein, the term "conformal growth" refers to a deposition process wherein a film is deposited with substantially the same thickness along one or more of a bottom surface, a sidewall, an upper corner, and outside a feature. "Conformal growth" is also intended to encompass some variations in film thickness, e.g., the film may be thicker outside a feature and/or near a top or upper portion of the feature compared to the bottom or lower portion of the feature.

The first step (e.g., a first step cycle) and/or the second step may be performed under conformal conditions such that conformal growth occurs. Conformal conditions include, but are not limited to temperature (e.g., of substrate, first metal-containing precursor, molybdenum-containing precursor, purge gas, co-reactant, reducing agent, etc.), pressure (e.g., during delivery of first metal-containing precursor, molybdenum-containing precursor, purge gas, co-reactant, reducing agent, etc.), amount of first metal-containing precursor, molybdenum-containing precursor, purge gas, co-reactant, and/or reducing agent delivered, length of purge time and/or amount of purge gas delivered.

In various aspects, the substrate may comprise one or more features where conformal growth may occur. In various aspects, the feature may be a via, a trench, contact, dual damascene, etc. A feature may have a non-uniform width, also known as a "re-entrant feature," or a feature may have substantially uniform width.

In any embodiment, a first film, a second film, or both grown following the methods described herein may be substantially continuous and conformal. In one or more embodiments, a first film, a second film, or both grown following the methods described herein may have substantially no voids and/or hollow seams.

In various aspects, the method may comprise delivering a first metal-containing precursor, a purge gas and at least one co-reactant to a surface of the substrate under sufficient conditions for the first metal-containing precursor to: (i) deposit the elemental metal and etch a portion of the first film; (ii) deposit the elemental metal, etch the a portion of the first film and allow for desorption of the etched portion of the first film; or (iii) deposit the elemental metal and allow for desorption of a portion of the first film; such that the first film conformably grows on at least a portion of the substrate. Under such conditions the first metal-containing precursor may undergo one or more of the following: (i) deposits the elemental metal and etches a portion of the first film; (ii) deposits the elemental metal, etches a portion of the first film and allows for desorption of the etched portion of the first film; or (iii) deposits the elemental metal and allows for desorption of a portion of the first film. Additionally or alternatively, the co-reactant may deposit the elemental metal.

In some embodiments, the first film and the second film may be deposited in the same reaction vessel. Alternatively, the first film and the second film may be deposited in different reactions vessels. For example, the first film may be deposited on a substrate in a first reaction vessel, and then the substrate with the first film deposited thereon may be moved to a second reaction vessel where the second film can be deposited on at least a portion of the first film.

In any embodiments, the methods described herein can further comprise annealing the as-deposited first film, the as-deposited second film, or both at higher temperatures. In other words, annealing can be performed after the last cycle for forming the first film and/or the last cycle for forming the second film.

Therefore, in some embodiments, the as-deposited first film, the as-deposited second film, or both may be annealed under vacuum, or in the presence of an inert gas such as Ar or $N_2$, or a reducing agent such as $H_2$, or a combination thereof such as, for example, 5% $H_2$ in Ar. Without being bound by theory, the annealing step may remove incorporated carbon, oxygen and/or nitrogen to reduce the resistivity and to further improve film quality by densification at elevated temperatures. Annealing may be performed at a temperature of greater than or equal to about 400° C., greater than or equal to about 700° C., or about 800° C.; from about 300° C. to about 800° C. or about 500° C. to about 800° C.

Applications

The films formed from the processes described herein are useful for memory and/or logic applications, such as dynamic random access memory (DRAM), complementary metal oxide semi-conductor (CMOS) and 3D NAND, 3D Cross Point and ReRAM.

Reference throughout this specification to "one embodiment," "certain embodiments," "one or more embodiments" or "an embodiment" means that a particular feature, structure, material, or characteristic described in connection with the embodiment is included in at least one embodiment of the present technology. Thus, the appearances of the phrases such as "in one or more embodiments," "in certain embodiments," "in one embodiment" or "in an embodiment" in various places throughout this specification are not necessarily referring to the same embodiment of the present technology. Furthermore, the particular features, structures, materials, or characteristics may be combined in any suitable manner in one or more embodiments.

Although the present technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the present technology. Thus, it is intended that the present technology include modifications and variations that are within the scope of the appended claims and their equivalents. The present technology, thus generally described, will be understood more readily by reference to the following examples, which is provided by way of illustration and is not intended to be limiting.

EXAMPLES

General Conditions $MoC_5$ (obtained from Strem Chemicals Inc.), $MoO_2Cl_2$ (obtained from MilliporeSigma), and (DMBD)$Ru(CO)_3$ (also referred to as RuDMBD) were utilized as the precursor in the following examples. Methods of preparing (DMBD) $Ru(CO)_3$ are known in the art. For example, see U.S. 2011/0165780, which is incorporated herein by reference in its entirety. Unless otherwise indicated, film thickness was measured via XRF and resistivity of films was based on ellipsometer thickness.

I. First Step

Unless otherwise indicated, a ruthenium elemental first film was deposited on a substrate using (DMBD)$Ru(CO)_3$ and $O_2$ in an ALD process in a CN1 ALD/CVD reactor with the following conditions:

i. Substrate temperatures: 250° C.

ii. (DMBD)$Ru(CO)_3$ at 40° C., delivered as follows to a substrate: 1 second pulse (DMBD)$Ru(CO)_3$ (bubbler), 10 seconds purge with argon, $O_2$ co-reactant (20 sccm) pulse 3 seconds, and purge 10 seconds with argon.

Unless otherwise indicated, a molybdenum elemental first film was deposited on a substrate using $MoCl_5$ and CHD in an ALD process in a Ultratech Savannah S200 reactor with the following conditions:

i. Substrate temperatures: 280° C.

ii. $MoCl_5$ at 114° C., delivered as follows to a substrate: 1 second pulse $MoCl_5$, 2 seconds purge with nitrogen, CHD co-reactant at 50° C. pulse 3 seconds, and purge 2 seconds with nitrogen.

II. Second Step

Unless otherwise indicated, a molybdenum-containing film was deposited using $MoO_2Cl_2$ and $H_2$ in a pulsed CVD process in a CN1 ALD/CVD reactor with the following conditions:

i. Substrate temperatures: 430° C.-490° C.

ii. $MoO_2Cl_2$ at 85° C. was pulsed with constant H2 flow in Ar: 1-2 seconds pulse $MoO_2Cl_2$ and 10-30 seconds purge with $H_2$ in Ar.

Example 1—Thermal Gravimetric Analysis of $MoO_2Cl_2$

Thermal gravimetric analysis (TGA) of $MoO_2Cl_2$ was performed and the results are shown in FIG. 1. $Mo_2O_2Cl_2$ showed clean evaporation at ~170° C. with negligible residue (1.6%). The vapor pressure of $MoO_2Cl_2$ is Log P(Torr)=11.747-(3830/T).

Example 2—Effect of Deposition Temperature on Growth Rate and Resistivity

Figure 2A:
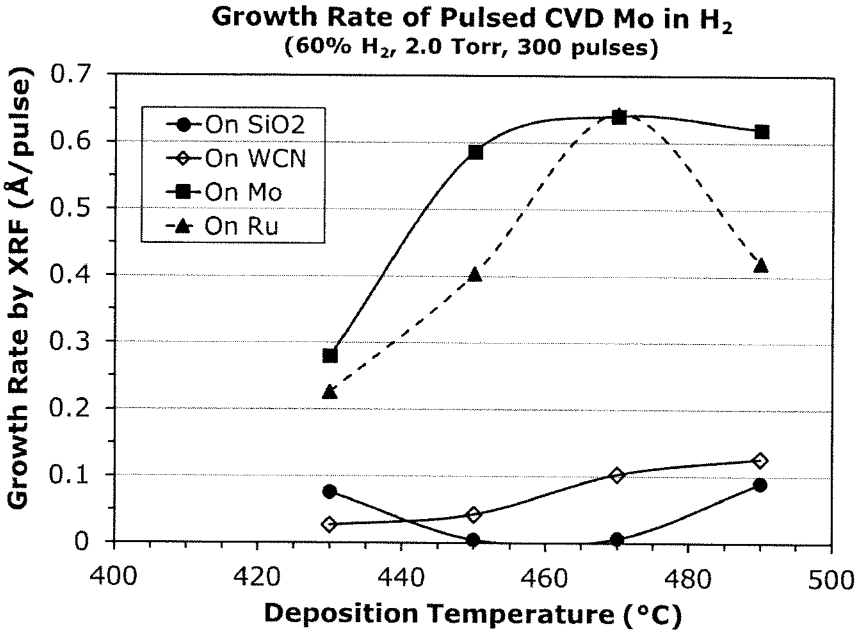
FIG. 2A is a graphical representation of growth rate (Å/pulse) vs. deposition temperature (° C.) for molybdenum-containing films grown on a $SiO_2$ substrate, a WCN substrate, a molybdenum elemental first film, and a ruthenium elemental first film according to Example 2.
Figure 2B:
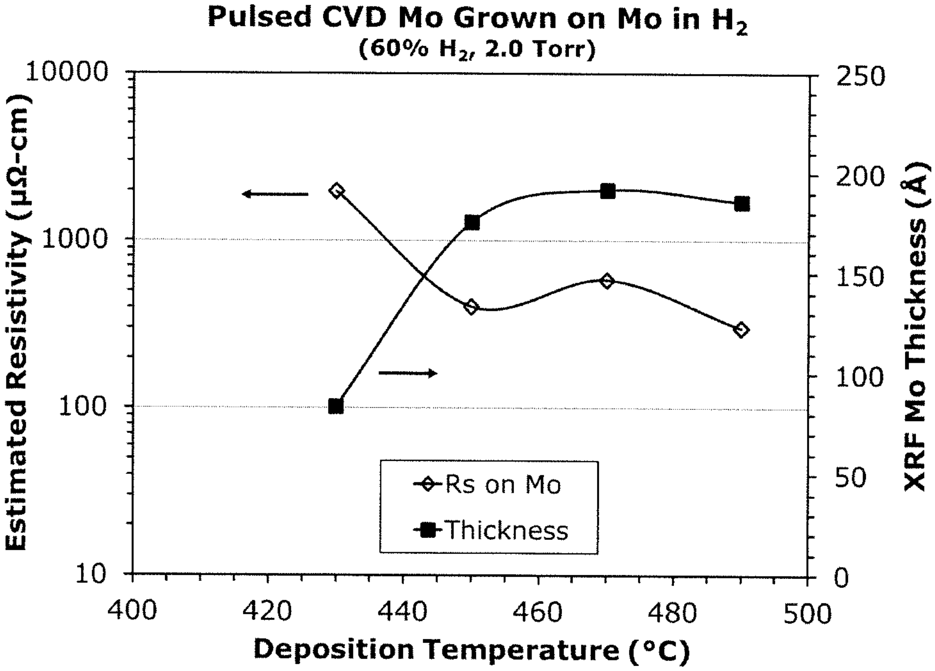
FIG. 2B is a graphical representation of resistivity (μΩ-cm) and molybdenum thickness (Å) vs. deposition temperature (° C.) for molybdenum-containing films grown on a molybdenum elemental first film according to Example 2.

A molybdenum elemental first film was grown on a $SiO_2$ substrate via the above ALD conditions and a molybdenum-containing film was deposited on the molybdenum elemental first film ("on Mo") via the above CVD conditions using 60% $H_2$, a pressure of 2.0 Torr, and 300 pulses at four different substrate temperatures, 430° C., 450° C., 470° C., and 490° C. A ruthenium elemental first film was grown on a $SiO_2$ substrate via the above ALD conditions and a molybdenum-containing film was deposited on the ruthenium elemental first film ("on Ru") via the above CVD conditions using 60% $H_2$, a pressure of 2.0 Torr, and 300 pulses at four different substrate temperatures, 430° C., 450° C., 470° C., and 490° C. A molybdenum-containing film was also deposited on a $SiO_2$ substrate ("on $SiO_2$") and a WCN substrate ("on WCN") via the above CVD conditions using 60% $H_2$, a pressure of 2.0 Torr, and 300 pulses at four different substrate temperatures, 430° C., 450° C., 470° C., and 490° C. Growth rate for the molybdenum-containing films at the four different temperatures was measured, as shown in FIG. 2A. It was observed that metallic Mo films deposited on a molybdenum elemental first film and a ruthenium elemental first film metals. There was slow growth of Mo on WCN and very little growth of Mo on $SiO_2$. Resistivity and thickness was also measured for the molybdenum-containing film on Mo at the four different temperatures, as shown in FIG. 2B.

Example 3—Effect of Deposition Pressure on Growth Rate and Resistivity

Figure 3A:
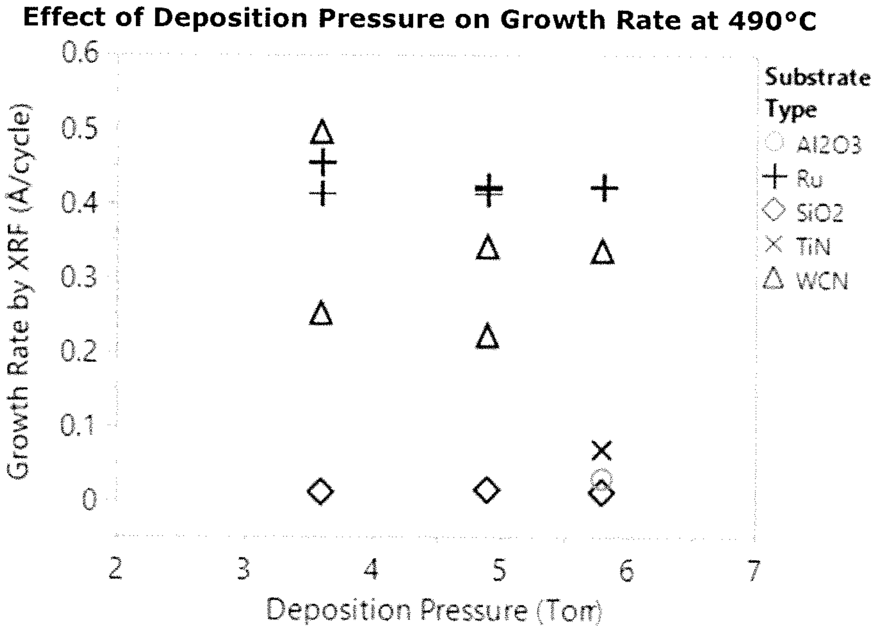
FIG. 3A is a graphical representation of growth rate (Å/cycle) vs. deposition pressure (Torr) for molybdenum-containing films grown on an $Al_2O_3$ substrate, a $SiO_2$ substrate, a WCN substrate, a TiN substrate, and a ruthenium elemental first film according to Example 3.
Figure 3B:
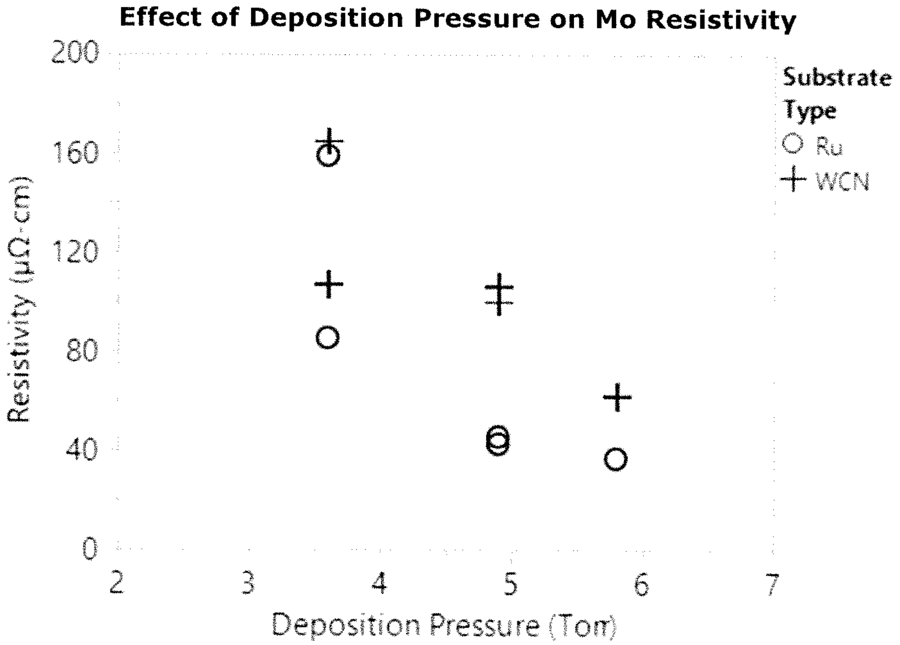
FIG. 3B is a graphical representation of resistivity (μΩ-cm) vs. deposition pressure (Torr) for molybdenum-containing films grown on a WCN substrate and a ruthenium elemental first film according to Example 3.

A ruthenium elemental first film was grown on a $SiO_2$ substrate via the above ALD conditions and a molybdenum-containing film was deposited on the ruthenium elemental first film ("Ru") via the above CVD conditions at a substrate temperature of 490° C. and at three different pressures of 3.6 Torr, 4.9 Torr, and 5.8 Torr. A molybdenum-containing film was also deposited on each of a $Al_2O_3$ substrate ("$Al_2O_3$"), a $SiO_2$ substrate ("$SiO_2$"), a TiN substrate ("TiN"), and a WCN substrate ("WCN") via the above CVD conditions at a substrate temperature of 490° C. and at three different pressures. Growth rate for the molybdenum-containing films at the three different pressures was measured, as shown in FIG. 3A. Growth rate appeared to be unaffected by the deposition pressure. Resistivity was also measured for the molybdenum-containing films deposited at the three different pressures at 490° C., as shown in FIG. 3B. Resistivity was found to decrease with increasing deposition pressure. The lowest resistivity was found for the molybdenum-containing film grown on the ruthenium elemental first film, which was ~37 μΩ-cm at 5.8 Torr

Figure 4:
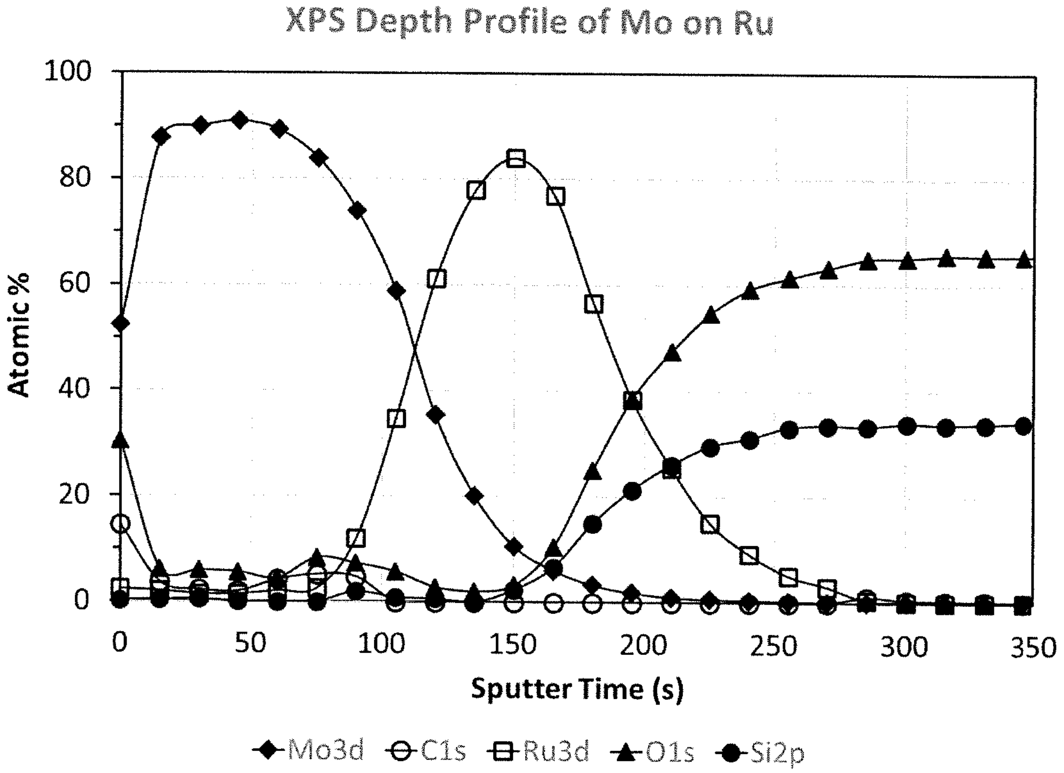
FIG. 4 is a graphical representation of an X-ray photoelectron spectroscopy (XPS) chemical composition for a molybdenum-containing film deposited on a ruthenium elemental first film according to Example 4.

Example 4—XPS Analysis of Molybdenum-Containing Film on Ruthenium First Film XPS analysis of a molybdenum-containing film deposited on a ruthenium elemental first film via the above CVD conditions at 490° C. and 5.8 Torr was performed. The results, as shown in FIG. 4, confirm that no Cl or C was present in the molybdenum-containing film and there was about 6 at % 0 present.

Example 5—Comparison of Molybdenum-Containing Films on Various Surfaces

Figure 5A:
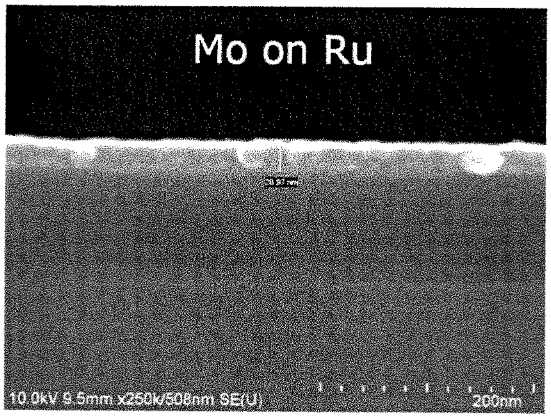
FIGS. 5A and 5B are scanning electron microscope (SEM) images of a molybdenum-containing film deposited on a ruthenium elemental first film.
Figure 5B:
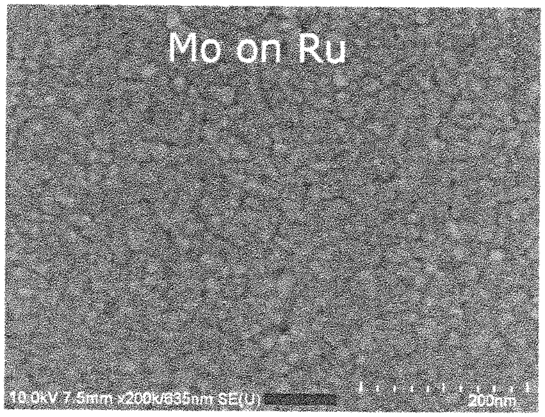
Figure 5C:
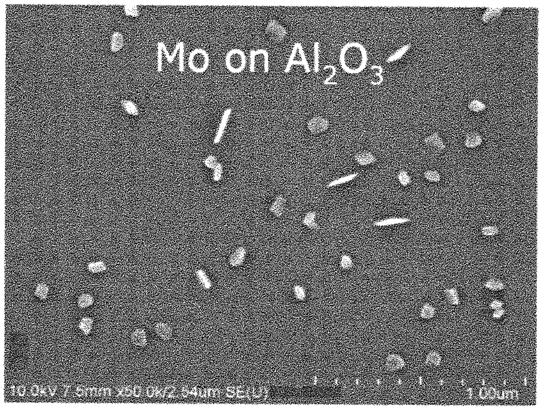
FIG. 5C is an SEM image of a molybdenum-containing film deposited on an $Al_2O_3$ substrate.
Figure 5D:
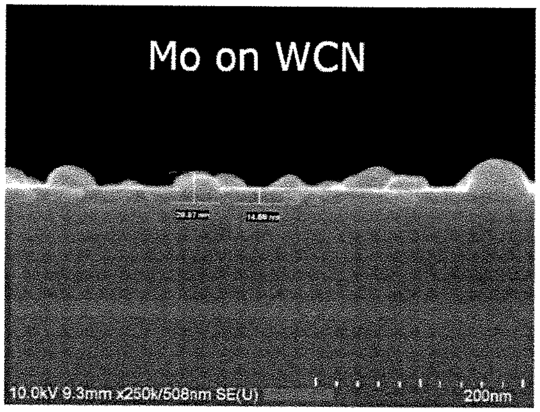
FIGS. 5D and 5E are SEM images of a molybdenum-containing film deposited on a WCN substrate.
Figure 5E:
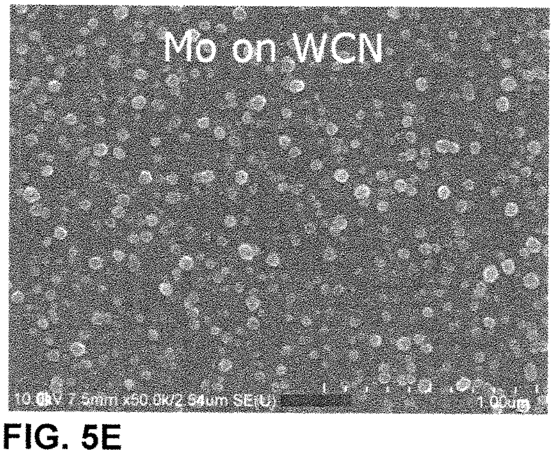

A ruthenium elemental first film (thickness 6 nm) was grown on a $SiO_2$ substrate via the above ALD conditions and a molybdenum-containing film was deposited on the ruthenium elemental first film via the above CVD conditions at a substrate temperature of 490° C. and a pressure of 5.8 Torr. FIG. 5A is an SEM image of a cross-sectional side view of the molybdenum-containing film on the ruthenium elemental first film showing a continuous molybdenum film (about 20 nm thickness). FIG. 5B is an SEM image of a top view of the molybdenum-containing film in FIG. 5A. A molybdenum-containing film was deposited on an $Al_2O_3$ substrate via the above CVD conditions at a substrate temperature of 490° C. and a pressure of 5.8 Torr. FIG. 5C is an SEM image of a top view of the molybdenum-containing film on the $Al_2O_3$ substrate showing isolate islands of molybdenum. A molybdenum-containing film was also deposited on WCN substrate via the above CVD conditions at a substrate temperature of 490° C. and a pressure of 5.8 Torr. FIG. 5D is an SEM image of a cross-sectional side view of the molybdenum-containing film on WCN showing scattered molybdenum crystals. FIG. 5E is an SEM image of a top view of the molybdenum-containing film in FIG. 5D.

Example 6—Film Formation in a Via of a $SiO_2$ Substrate

Figure 6A:
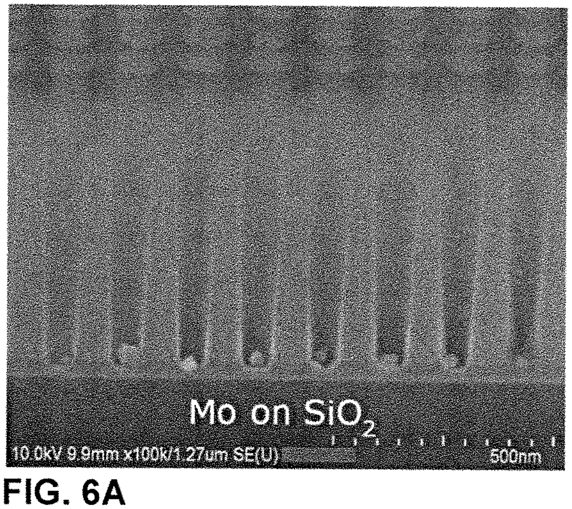
FIGS. 6A-6C are cross-sectional SEM images of via structures of a $SiO_2$ substrate with a molybdenum-containing film deposited directly in the via structures, on a TiN liner in the via structures, and on a molybdenum elemental first film liner deposited in the via structures, respectively.
Figure 6B:
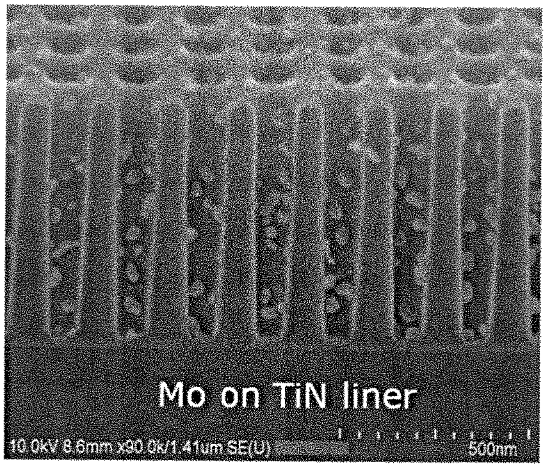
Figure 6C:
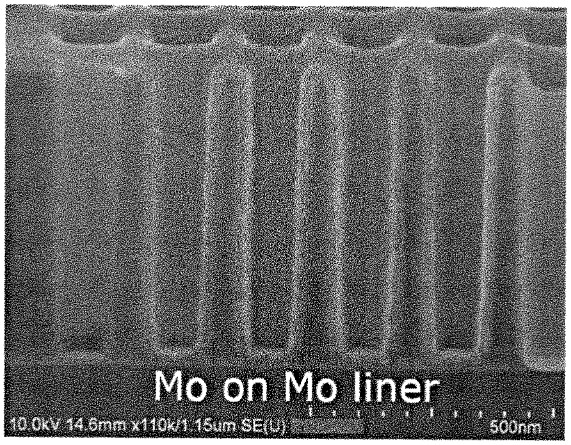

A molybdenum-containing film was deposited in vias present in a $SiO_2$ substrate via the above CVD conditions at a substrate temperature of 490° C. FIG. 6A is an SEM image of a cross-sectional side view of $SiO_2$ vias showing no molybdenum growth except at the bottom due to trapped precursor. A TiN liner was deposited on $SiO_2$ vias by ALD at 225° C. using tetrakis(dimethylamido)titanium (TDMAT) and ammonia. A molybdenum-containing film was deposited on a TiN liner (thickness about 2 nm) in vias present in a $SiO_2$ substrate via the above CVD conditions at a substrate temperature of 490° C. FIG. 6B is an SEM image of a cross-sectional side view of TiN lined $SiO_2$ vias showing molybdenum growth as islands with large grains. A molybdenum elemental first film (thickness 2.5 nm) was grown in vias present in a $SiO_2$ substrate via the above ALD conditions at substrate temperature of 280° C. and a molybdenum-containing film was deposited on the molybdenum elemental first film via the above CVD conditions at a substrate temperature of 490° C. FIG. 6C is an SEM image of a cross-sectional side view of Mo lined $SiO_2$ vias showing a uniform, conformal, and smooth molybdenum-containing film (thickness about 20 nm).

Example 7—Film Formation in a Via of a TiN Substrate

Figure 7A:
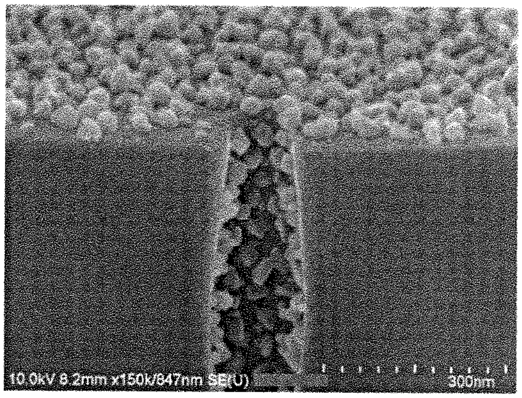
FIGS. 7A and 7B are cross-sectional SEM images of a TiN via structure with a molybdenum-containing film deposited directly in the TiN via structure.
Figure 7C:
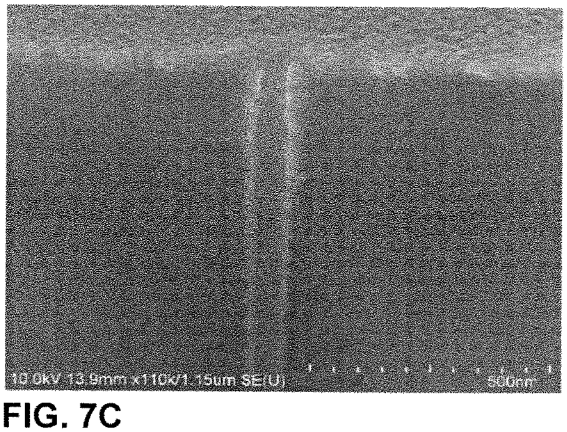
FIGS. 7C and 7D are cross-sectional SEM images of a molybdenum-containing film deposited on a molybdenum elemental first film liner deposited in a TiN via structure.
Figure 7B:
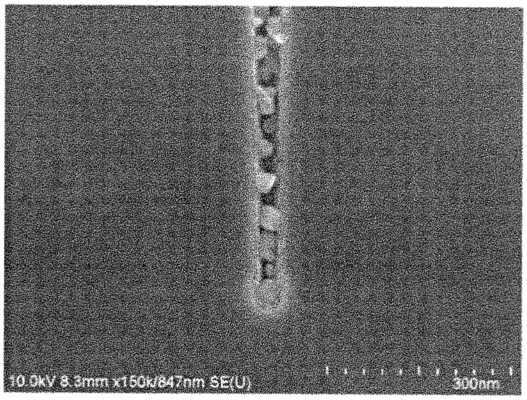
Figure 7D:
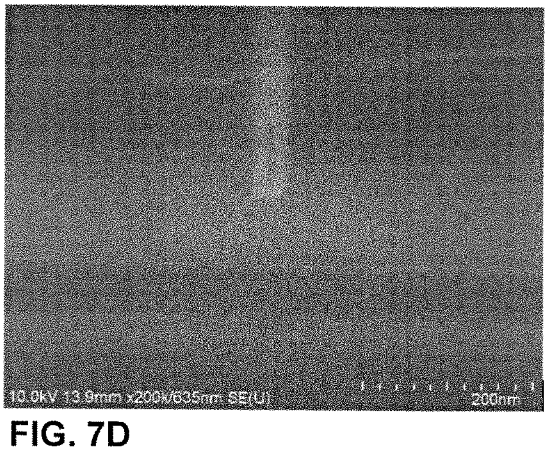

A molybdenum-containing film was deposited in a via at a substrate temperature of 490° C. a TiN substrate via the above CVD conditions. FIGS. 7A and 7B are SEM images of a cross-sectional side view of a TiN via showing a molybdenum-containing film as large grains. A molybdenum elemental first film (Mo liner, thickness 3.2 nm) was grown in a via of a TiN substrate via the above ALD conditions at substrate temperature of 280° C. and a molybdenum-containing film was deposited on the molybdenum elemental first film via the above CVD conditions. FIGS. 7C and 7D are SEM images of a cross-sectional side view of a Mo lined TiN via showing uniform and conformal molybdenum-containing film growth as small grains.

All publications, patent applications, issued patents and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The words "comprise", "comprises", and "comprising" are to be interpreted inclusively rather than exclusively.

What is claimed is:

1. A method for forming a molybdenum-containing film, the method comprising:

A. thermally depositing a first film comprising an elemental metal on a surface of a substrate at a first temperature less than or equal to about 400° C., wherein the elemental metal is cobalt; and B. thermally depositing a second film on at least a portion of the first film at a second temperature of greater than about 400° C., wherein the second film comprises a reaction product of a molybdenum-containing precursor with a reducing agent.

2. The method of claim 1, wherein the first film has a thickness of greater than or equal to about 2 nm.

3. The method of claim 1, wherein the thermally depositing the first film comprises delivering a first metal-containing precursor and a co-reactant to the substrate, wherein the first metal-containing precursor is a cobalt-containing precursor.

4. The method of claim 1, wherein the thermally depositing the second film comprises delivering the molybdenum-containing precursor and the reducing agent to the substrate, wherein the molybdenum-containing precursor is a molybdenum halide or a molybdenum oxyhalide.

5. The method of claim 4, wherein molybdenum halide is $MoCl_5$ or $MoF_6$, the molybdenum oxyhalide is $MoOCl_4$ or $MoO_2Cl_2$, the reducing agent is hydrogen or hydrogen plasma, and/or the co-reactant is selected from the group consisting of 1,4-di-trimethylsilyl-2-methyl-cyclohexa-2,5-diene (CHD), 1,4-bis-trimethylsilyl-1,4-dihydropyrazine (DHP), 1-trimethylsilylcyclohexa-2,5-diene, nitrogen plasma, ammonia plasma, oxygen, air, water, ozone, $NH_3$, $H_2$, hydrazine, alkylhydrazine, and a combination thereof.

6. The method of claim 1, wherein the first temperature is less than or equal to about 300° C. and/or the second temperature is about 400° C. to about 600° C.

7. The method of claim 1, wherein the second film is substantially continuous and conformal and/or the second film has a resistivity of less than or equal to about 200 μΩ-cm.

8. The method of claim 1, wherein the thermally depositing the first film is performed at a pressure of about 0.1 Torr to about 6 Torr and/or wherein the thermally depositing the second film is performed at a pressure of about 1 Torr to about 100 Torr.

9. The method of claim 1, wherein the first film is thermally deposited by chemical vapor deposition or atomic layer deposition and/or wherein the second film is thermally deposited by chemical vapor deposition or atomic layer deposition.

* * * * *